DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JULY 18, 1972

900 O.G. 819

T900,011
SENSITIZERS FOR LIGHT SENSITIVE POLYMER COMPOSITIONS

Melvin S. Bloom and Alfredo R. Guevara, both of Kodak Park Works, Rochester, N.Y. 14650

Filed Sept. 13, 1971, Ser. No. 180,196
**Int. Cl. G03c *1/68***
U.S. Cl. 96—115
No Drawing. 10 Pages Specification

Light sensitive polymer compositions containing photocrosslinkable polymers, such as polymers containing the diphenylcyclopropene carboxylate moiety, can be sensitized with sensitizers having the following structural formula

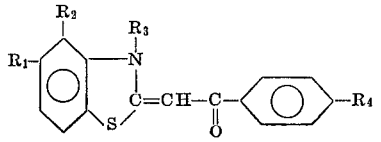

wherein $R_1$ is halo, particularly chloro, $R_2$ is hydrogen or, taken together with $R_1$ represents the atoms necessary to complete a fused benzene ring, $R_3$ is lower alkyl having 1 to 4 carbon atoms, particularly ethyl, $R_4$ is an electronegative substituent, particularly cyano or trifluoromethyl.

Representative sensitizers include 2-(p-cyanobenzoylmethylene)-3-ethylnaphtho[1,2-d]thiazoline, 3-ethyl-2-[p-(trifluoromethyl)benzoylmethylene]-naphtho[1,2 - d]thiazoline and 5-chloro-2-(p-cyanobenzoylmethylene)-3-ethylbenzothiazole.